United States Patent [19]
Ngo

[11] Patent Number: 6,020,274
[45] Date of Patent: *Feb. 1, 2000

[54] METHOD AND SYSTEM FOR USING $N_2$ PLASMA TREATMENT TO ELIMINATE THE OUTGASSING DEFECTS AT THE INTERFACE OF A STOP LAYER AND AN OXIDE LAYER

[75] Inventor: Minh Van Ngo, Union City, Calif.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/785,909

[22] Filed: Jan. 21, 1997

[51] Int. Cl.[7] .................................................. H01L 21/316
[52] U.S. Cl. .............................. 438/788; 438/513; 438/12
[58] Field of Search ................................ 438/12, 513, 788

[56] References Cited

U.S. PATENT DOCUMENTS

| | | | |
|---|---|---|---|
| 4,621,277 | 11/1986 | Ito et al. | 357/54 |
| 5,536,681 | 7/1996 | Jang et al. | 437/195 |
| 5,677,234 | 10/1997 | Koo et al. | 437/69 |

*Primary Examiner*—Olik Chaudhuri
*Assistant Examiner*—Hoai V. Pham
*Attorney, Agent, or Firm*—Sawyer & Associates

[57] ABSTRACT

The present invention provides a device and a method for substantially minimizing defects on the surface of the interface of the stop layer and the oxide layer during manufacturing of a semiconductor device. A method according to the present invention for minimizing defects in a semiconductor device, the method including the steps of depositing a stop layer, the stop layer having a surface; bombarding the surface of the stop layer with N2 using a power of at least approximately 320 W; and depositing the oxide layer over the stop layer.

8 Claims, 3 Drawing Sheets

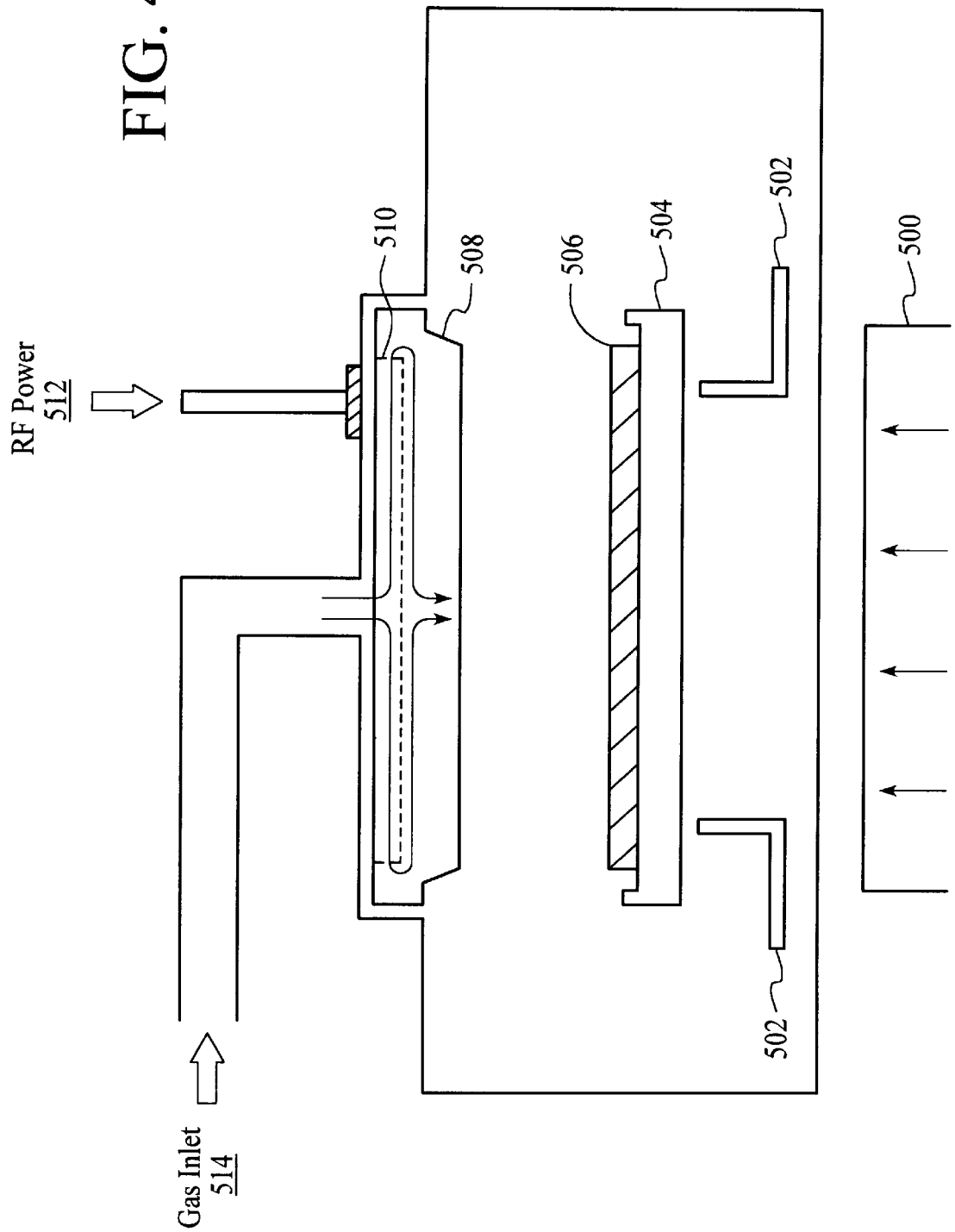

METHOD AND SYSTEM FOR USING N₂ PLASMA TREATMENT TO ELIMINATE THE OUTGASSING DEFECTS AT THE INTERFACE OF A STOP LAYER AND AN OXIDE LAYER

FIELD OF THE INVENTION

The present invention relates to a method for eliminating defects at an interface of a nitride etch stop layer and an oxide layer in a semiconductor device, and a device resulting therefrom.

BACKGROUND OF THE INVENTION

Semiconductor devices, such as complementary metal-oxide semiconductor (CMOS) transistors, are widely used in applications requiring high-speed, low power digital circuits including microprocessors, memory devices and gate arrays. These semiconductor devices are typically fabricated by bonding silicon dioxide layers on a silicon substrate. The silicon dioxide layers are selectively etched away with a plasma current to expose the silicon substrate. Exposed silicon on either side of a non-etched area is implanted with ions to create source and drain areas. A conductive layer is deposited on the non-exposed area to create a gate for the transistor. Additional conductive layers are disposed on the source and drain areas to provide electrical connection thereto. The conductive layers are typically separated by a dielectric material. Multiple layers of conductive material are also disposed elsewhere on the substrate to provide pads for external connection to the transistor. The pads are typically connected to the transistor by the conductive layers and the interlayer connections therebetween.

During the numerous steps required to manufacture semiconductor devices, the silicon substrate needs to be isolated from interconnects which will be located above it. Several steps are typically taken to accomplish such isolation. The first isolation step typically consists of disposing a nitride stop layer above the silicon substrate and field oxide. Thereafter, an oxide layer is typically disposed above the nitride stop layer.

A common problem which can occur at the interface of the nitride stop layer and the oxide layer is to have small bubble-like defects which in turn cause exaggerated defects on the surface of the oxide layer. These defects typically cause reliability problems and can cause poison contact problems.

It is possible to eliminate these defects by using a wet cleaning step such as RCA and HF dip. However, utilizing a wet cleaning step can cause pinholes on the very thin nitride layer. Additionally, this solution requires an extra step, resulting in longer cycle times, and additional wafer handling which can add additional particles and scratches.

What is needed is a device in which these defects are eliminated, and a method for eliminating these defects which improves reliability, reduces cost of manufacturing, and simplifies manufacturing. The present invention addresses such a need.

SUMMARY OF THE INVENTION

The present invention provides a device and a method for substantially minimizing defects on the surface of the interface of the stop layer and the oxide layer during manufacturing of a semiconductor device.

A method according to the present invention for minimizing defects in a semiconductor device, the method comprising the steps of depositing a stop layer, the stop layer having a surface; bombarding the surface of the stop layer with N2 using a power of at least approximately 320 W in the same process chamber of the stop layer; and depositing the oxide layer over the nitride stop layer.

In another aspect of the invention, a semiconductor device in which defects have been substantially minimized, the semiconductor device comprises a stop layer, the stop layer having a surface which has been bombarded with N2 using a power of at least approximately 320 W to eliminate at least one defect on the surface; and an oxide layer over the stop layer.

BRIEF DESCRIPTION OF THE DRAWINGS

FIG. 4 is a diagram of a processing chamber which the method and device of the present invention utilizes.

DESCRIPTION OF THE INVENTION

The present invention relates to a device and method for eliminating defects on a surface of an interface of a nitride stop layer and an oxide layer during manufacturing of a semiconductor device. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
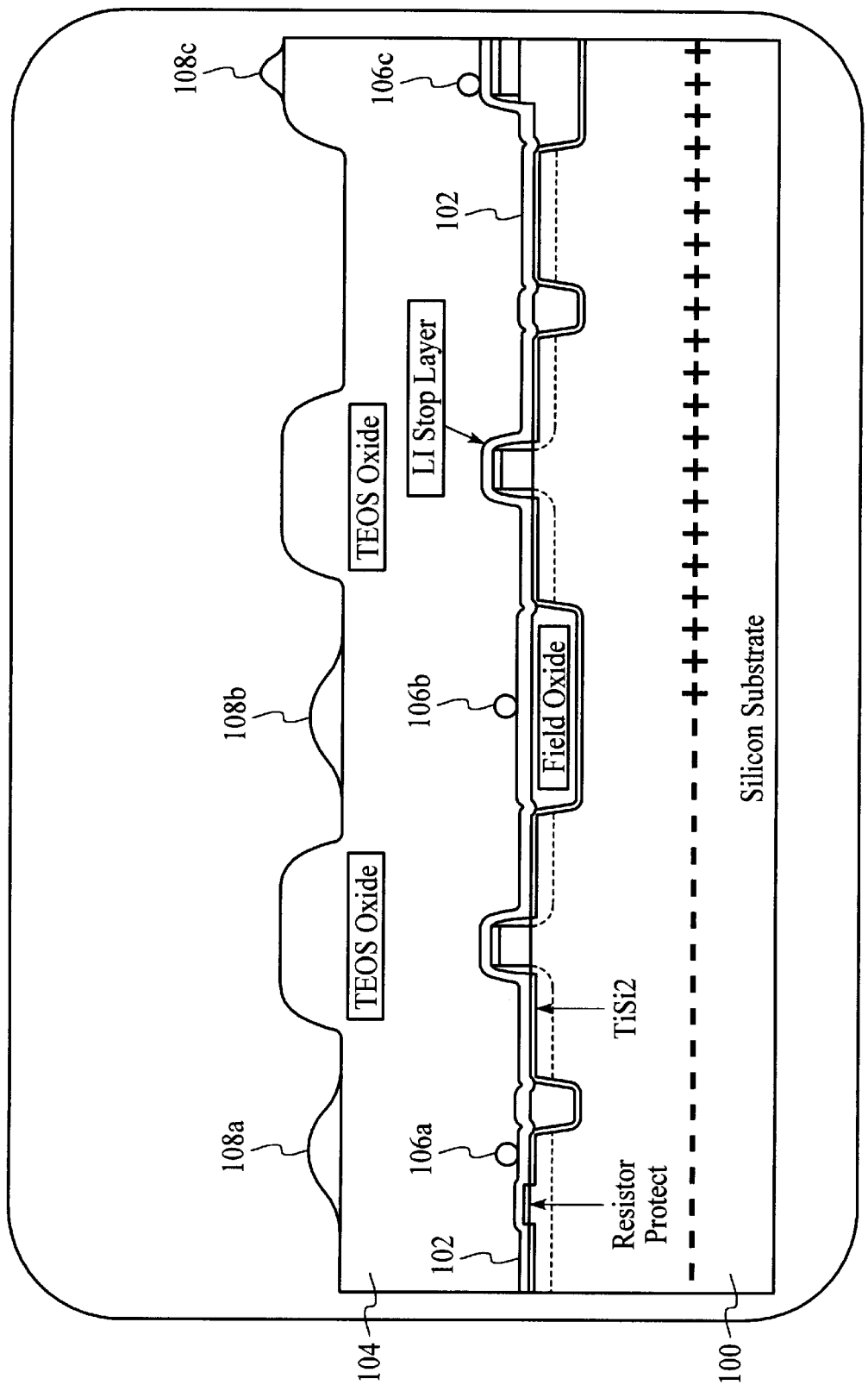
FIG. 1 is a cross-sectional diagram of a semiconductor device during a step of isolating the substrate during manufacturing of the semiconductor device.

FIG. 1 is a diagram of a cross section of a semiconductor device during manufacturing during a step of isolating the substrate from interconnects to be located above it. Above the silicon substrate 100, is the nitride stop layer 102. Above the nitride stop layer 102 is the oxide layer 104. In the interface between the oxide layer 104 and the nitride layer 102, some small defects 106a–106c are shown. The typical size of these defects are approximately 0.07–0.1μ. These small defects 106a–106c in the interface cause exaggerated defects 108a–108c on the surface of the oxide layer 104. The resulting defects on the surface of the oxide layer 104 are typically approximately 0.2–0.5μ.

As previously stated, these defects 106 and 108 can cause reliability problems for the semiconductor devices and also can cause poison contact problems. Thus, it is critical to eliminate these defects 106 and 108.

Figure 2:
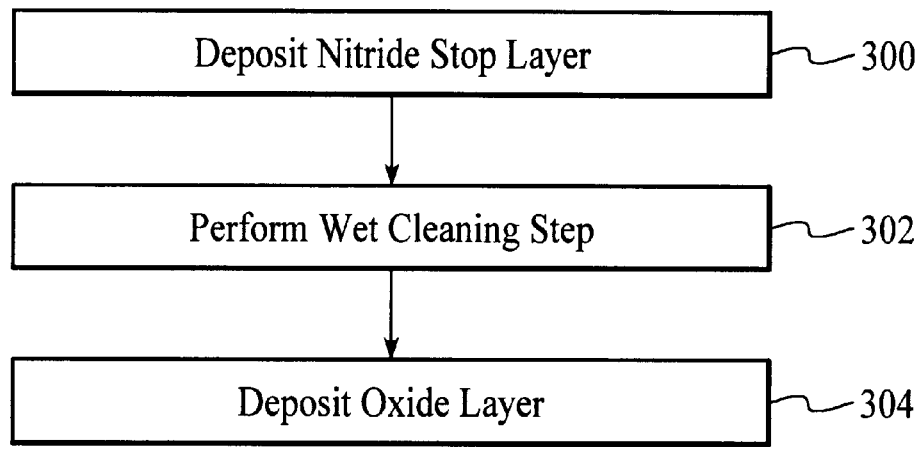
FIG. 2 is a flow diagram of a conventional method for eliminating defects on a surface of an interface of a nitride stop layer and an oxide layer.

FIG. 2 shows a flow diagram of a conventional method for eliminating these defects 106 and 108. The nitride stop layer is deposited above the silicon substrate via step 300. A wet cleaning step is then performed via step 302. An example of a wet cleaning step would include the steps if removing the semiconductor wafer from the deposition chamber, utilizing an RCA and HF dip, and finally returning the semiconductor wafer to the deposition chamber. After the wet cleaning step is performed via step 302, the oxide layer is deposited via step 304.

The performance of the wet cleaning step can significantly increase the cycle time for manufacturing the semiconductor devices consumes chemical which results in higher cost. Additionally, the wet cleaning step requires additional handling on the semiconductor wafer which is likely to introduce additional particles and scratches.

Figure 3:
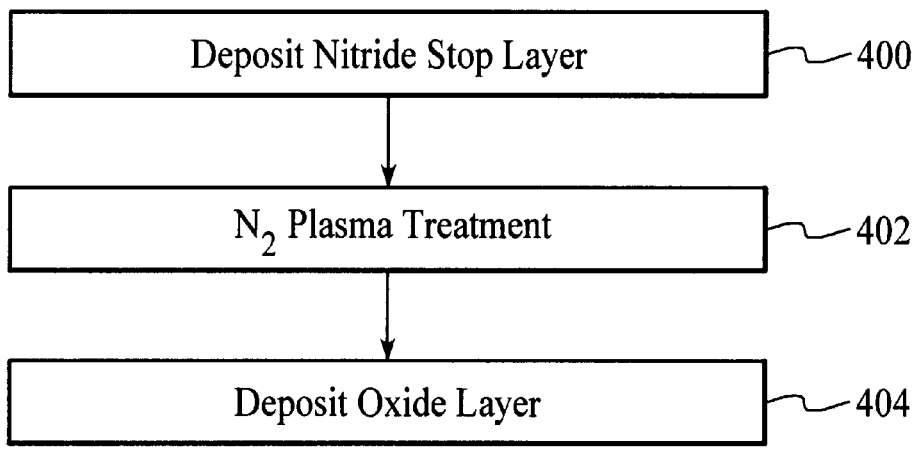
FIG. 3 is a method according to the present invention.

FIG. 3 is a flow diagram of a method according to the present invention. The nitride stop layer 102 is deposited via step 400. Then a $N_2$ plasma treatment is applied via step 402 in the same process deposition chamber of the stop layer 102. After the plasma treatment, the oxide layer 104 is then deposited via step 404.

The plasma treatment eliminates the small defects 106 shown in FIG. 1 located on the surface of the interface of the nitride stop layer 102 and the oxide layer 104. These defects 106 are eliminated through the bombardment of a material, such as $N_2$, on the surface of the nitride layer 102. The plasma bombardment is preferably substantially uniform across the surface of the nitride layer 102.

Although a variety of combinations of process recipes may be used for the plasma treatment, the preferred bombardment material is $N_2$=530–580 SCCM, power=320–360 watts, temperature=400 C., pressure=3.5 T, spacing=3.60 MILS, and time=30 seconds. Variations of this recipe can be utilized to achieve the same goals. For instance, the temperature can be higher than 400 C., the pressure can be higher than 3.5 T, and the time can be longer than 30 seconds.

The advantages of using the method according to the present invention include improved reliability, reduction of manufacturing costs, and simplified manufacturing. Utilizing the $N_2$ plasma treatment allows the elimination of defects 106 and 108 while the semiconductor wafer is in the deposition chamber. Since this solution does not require the semiconductor wafer to be removed from the deposition chamber, it reduces handling, labor, and time. An additional advantage of the present invention is the short time, such as thirty seconds, required to eliminate the defects 106 and 108.

FIG. 4 is a diagram of a deposition chamber which can be used in accordance with the present invention. It includes a heating lamp 500, lift pins 502, a susceptor 504, a semiconductor wafer 506, a showerhead 508, a blocker plate 510, a radio frequency power source 512, and a gas inlet 514.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for minimizing defects in a semiconductor device, the method comprising the steps of:

a) depositing a stop layer, the stop layer having a surface;

b) bombarding the entire surface of the stop layer with N2 using a power of at least approximately 320 watts; and c) depositing an oxide layer over the stop layer, wherein the bombarding of the surface of the stop layer eliminates small defects on an interface between the oxide layer and the stop layer and eliminates large defects related to the small defects on the oxide layer.

2. The method of claim 1, wherein the $N_2$ is approximately within a range of 530–580 sccm.

3. The method of claim 1, wherein a power used for the bombarding step is approximately within the range of 320–360 watts.

4. The method of claim 1, wherein a temperature used for the bombarding step is approximately at least 400 C.

5. The method of claim 1, wherein a pressure used for the bombarding step is approximately at least 3.5 T.

6. The method of claim 1, wherein a spacing used for the bombarding step is approximately at least 360 mils.

7. The method of claim 1, wherein a time period of the bombardment step is approximately at least 30 secs.

8. The method of claim 1, wherein the surface has at least one defect and the bombarding step eliminates the at least one defect.

* * * * *